United States Patent [19]

Imai et al.

[11] Patent Number: 5,252,825
[45] Date of Patent: Oct. 12, 1993

[54] ABSOLUTE ENCODER USING INTERPOLATION TO OBTAIN HIGH RESOLUTION

[75] Inventors: Motokatsu Imai, Yokohama; Koh Ohno, Zama; Tsuyoshi Matsumoto, Tokyo, all of Japan

[73] Assignee: Nikon Corporation, Tokyo, Japan

[21] Appl. No.: 728,269

[22] Filed: Jul. 11, 1991

[30] Foreign Application Priority Data

Jul. 18, 1990 [JP] Japan .................. 2-187988

[51] Int. Cl.$^5$ ............................................. G01D 5/34
[52] U.S. Cl. ............................ 250/231.18; 250/237 G
[58] Field of Search ........................ 250/231.14, 231.16, 250/231.18, 237 G; 341/13, 11; 356/375, 373

[56] References Cited

U.S. PATENT DOCUMENTS

| | | | |
|---|---|---|---|
| 4,572,952 | 2/1986 | March | 250/231.14 |
| 4,945,231 | 7/1990 | Ohya et al. | 250/231.14 |
| 5,068,529 | 11/1991 | Ohno et al. | 250/231.18 |

FOREIGN PATENT DOCUMENTS

| | | | |
|---|---|---|---|
| 0175613 | 8/1987 | Japan | 250/231.18 |
| 1-152314 | 6/1989 | Japan . | |
| 2-35314 | 2/1990 | Japan . | |

Primary Examiner—Davis L. Willis
Assistant Examiner—Hoa Q. Pham
Attorney, Agent, or Firm—Shapiro and Shapiro

[57] ABSTRACT

An absolute encoder device comprises a code plate having a 1-track type absolute pattern whose minimum reading unit length is $\lambda$, a first incremental pattern with a pitch $\lambda$, and a second incremental pattern with pitch $2^{-n}\lambda$. The device also comprises a detector section, which is movable relative to the code plate, which includes a detector detecting the absolute pattern and obtaining an absolute pattern signal, a detector detecting a first incremental pattern and obtaining a first incremental signal, and a detector detecting a second incremental pattern and obtaining a second incremental pattern signal. A shorter cyclic incremental signal is generated from the first incremental signal by interpolating and the shorter cyclic signal is synchronized with the second incremental signal. The absolute pattern signal, the second incremental signal and the synchronized first incremental signal represent the relative positional relationship between the code plate and the detector section.

1 Claim, 6 Drawing Sheets

ABSOLUTE ENCODER USING INTERPOLATION TO OBTAIN HIGH RESOLUTION

BACKGROUND OF THE INVENTION

1. Field of the Invention

This invention relates to an absolute encoder which is provided with a code plate having a 1-track type absolute pattern and which reads absolute positional information of a detector section around the code plate from the pattern, and more particularly to a method of improving resolution of the absolute encoder by subdividing a minimum read unit of the absolute pattern (interpolation processing).

2. Related Background Art

An absolute encoder is a measuring device in which sensors located on a detector section of the encoder read special detected patterns formed on a code plate and thus generate a signal which indicates an absolute position of a detector section around a code plate. The detected patterns indicate each of different address information of various positional relationships between the code plate and the detector section. In prior art of absolute encoders, a multi-track type encoder is well known in which a plurality of digital repeating patterns (incremental patterns) having different pitches respectively are arranged on the code plate of the encoder in parallel and addresses of the absolute position are indicated by each signal received from the same phase position of the plural patterns.

On the other hand, as seen in Japanese Patent Application Laid-Open No. 1-152314, recently, a 1-track type encoder has been well researched in which addresses of an absolute position are indicated by detecting a plurality of phase positions on a detected pattern (a 1-track type absolute pattern) with a minimum read unit according to a special sequence. Compared with the multi-track type encoder, the 1-track type absolute encoder is easy for construction and adjustment of a sensor and suitable for miniaturization of a code plate.

It is reported that a 1-track type absolute encoder is improved through this research and development in which incremental patterns are arranged in parallel with an absolute pattern on the code plate. Prior art, shown in Japanese Patent Application Laid-Open No. 2-35314, for example, is known in which read time of a 1-track type absolute encoder is controlled by detected signals or resolution of the encoder is improved by combining an address obtained from a 1-track type absolute pattern with signals (0, 1) received from incremental patterns.

FIG. 6 is a typical plan view of the absolute encoder whose resolution is improved.

As shown in FIG. 6, the first incremental track H1 with pitch λ, the second incremental track H2 with pitch λ/2 and the third incremental track H3 with pitch λ/4 are formed on the code plate A in parallel with the 1-track type absolute pattern P in which the length of a minimum read unit is λ. Photo sensors S1-S4 and U1-U3 are mounted on a detector section B respectively to detect four minimum read units next to one another on the track P and tracks H1-H3.

The track P represents all 4-bit codes in a cycle sequence which moves from a symbol ▽ in a clockwise direction; and white and black sections mean 0 and 1 respectively, wherein the sequence is

0000100110101111.

Each of the 4-bit codes in the sequence differs from the others. As shown in FIG. 6, if the detector section B is moved in a clockwise direction in succession, binary digit codes which are obtained from the outputs of the photo sensors S1-S4 are 16 types: 0000, 0001, 0010, 0100, 1001, 0011, 0110, 1101, 1010, 0101, 1011, 0111, 1111, 1110, 1100, and 1000 every λ movement quantity. The codes discriminate each of 16 absolute positions.

On the other hand, from the outputs of the photo sensors U1-U3 which read the tracks H1-H2, in which the white and the black sections are 0 and 1 respectively, 3-bit codes: 111, 110, 101, 100, 011, 010, 001, and 000 every λ/8 in a clockwise direction in all λ sections on the code plate are obtained. The multi-track type absolute encoder is composed of tracks H1-H3 and photo sensors U1-U2.

A total of each 7-digit different absolute positional information items, in which the detector section B can take all positional relationships every λ/8 on the code plate A, can be obtained in such a manner that codes which are obtained from the photo sensors U1-U3 as high order 3 digits are combined with codes obtained from the photo sensors S1-S4 as low order 4 digits.

If all cycle sequences which can discriminate 128 absolute positions per cycle every λ/8 are employed and a 1-track type absolute pattern which expresses the sequences with the white and the black sections is applied to the track P, an absolute encoder of the same resolution can be obtained without tracks H1-H3. However, if a minimum read unit of the 1-track type absolute pattern is minimized the sensor is also required to be minimized and reading precision (reliability) is hard to preserve owing to constraint of processing and mounting of the sensor. In an absolute encoder having additional three tracks H1-H3, as shown in FIG. 6, since a minimum section is discriminated by incremental patterns, if a detection method which utilizes a characteristic of the cycle (rule) is employed, far higher reading precision can be obtained than that of the above-described pure 1-track type encoder.

FIGS. 7A to 7C illustrate examples of detection methods utilizing a characteristic of this pattern. FIG. 7A is a vertical sectional view of a typical detector section. FIG. 7B is a line view of the amount of receiving light from the detector section. FIG. 7C is a line view of incremental signals obtained from the amount of receiving light. This art has been widely used in a multi-track type absolute encoder in general.

Referring to FIG. 7A, incremental tracks H with pitch λ are formed on the code plate A. The detector section is composed of a light F for pattern reading, a collimating lens L1 for obtaining parallel light, an index scale (mask) M whose pattern of pitch like track H is formed for 5 pitches in length, a condensing lens L2 for condensing, and a sensor U.

In the above-described detector section B, light radiated from light F changes into parallel light through the lens L1. The light which penetrates a 5-pitch overlapping section between the scale M and the track H is condensed into the sensor U through the lens L2.

In a 1-pitch movement of detector section B around the code plate A, as shown in FIG. 7B, a level of light detected from the sensor U goes up and down in a triangular wave-shaped manner and the wave forms peaks and bottoms have a high signal-to-noise ratio. Also, by a circuit which compares the amount of light detected with a reference level at a broken line shown in FIG. 7B, incremental signals which discriminate two conditions on 1-pitch can be obtained (FIG. 7C).

In this way, small pitches can be read without miniaturization of the sensor. In the absolute encoder as shown in FIG. 6, if this method of detection is applied to tracks H1-H3, the resolution of the encoder can be increased to $2^n$, wherein n represents 3 incremental tracks.

If a method of an absolute encoder as shown in FIG. 6 is considered further, an absolute encoder having far higher resolution can be obtained by adding a track H4 with pitch $\lambda/8$ and a track H5 with pitch $\lambda/16$ to the code plate A. However, if the number of tracks is increased, since the code plate A is gradually maximized and the number of sensors is also increased, the tracks and sensors are hard to mount and adjust on the encoder and most of the merits of 1-track type absolute patterns disappear. It is pointed out that the absolute encoder is preferably designed by employing the multi-track type from the beginning.

SUMMARY OF THE INVENTION

An object of the present invention is to provide an absolute encoder having a 1-track type absolute encoder pattern in which high resolution similar to an encoder as shown in FIG. 6 is achieved without increasing the number of incremental tracks.

An absolute encoder related to the present invention comprises:

a code plate having a 1-track type absolute pattern whose length of a minimum read unit is $\lambda$, a first incremental pattern with pitch $\lambda$, and a second incremental pattern with pitch $2^{-n}\lambda$, each of the patterns being formed on the code plate;

a detector section including means for detecting the absolute pattern so as to obtain an absolute pattern signal, means for detecting said first incremental pattern so as to obtain a first incremental signal, and means for detecting said second incremental pattern so as to obtain a second incremental signal, said detector section being movable relative to said code plate;

first interpolation means for producing an interpolated first incremental signal having a shorter cycle by means of interpolation based on said first incremental signal; and synchronization means for synchronizing said interpolated first incremental signal and said second incremental signal so as to obtain a synchronized first incremental signal;

wherein said absolute pattern signal, said second incremetal signal, and said synchronized first incremental signal indicate a relative positional relationship between said code plate and said detector section.

From the above-described construction, the absolute encoder of the present invention will have an improved resolution.

It is preferable that the above-described absolute encoder further comprise a second interpolation means which generates a second interpolated incremental signal having a shorter cycle. In this case, resolution is further improved.

In an absolute encoder of this invention, the length $\lambda$ of a minimum read unit of the absolute pattern is divided and segmented, each of individual address codes is allocated to each of the segments, and the address code of each segment in pitch $\lambda$ is added to the absolute positional information every pitch $\lambda$ obtained from the 1-track type absolute pattern similar to the absolute encoder as shown in FIG. 6, whereby absolute positional information of high resolution can be obtained. Not including count processing of the incremental signals, the absolute positional information is generated from signals obtained from the absolute pattern and the first and second incremental patterns.

The absolute encoder, as shown in FIG. 6, obtains m bit signals, such as $2^1, 2^2, 2^m \ldots$ etc., from m incremental pattern tracks. However, the absolute encoder of the present invention generates n bit signals which are the same as above $2^1, 2^2, 2^n \ldots$ (where n is an integer greater than 2) from a pitch $\lambda$ incremental pattern by an interpolation means. Next, each of phases of the generated n bit signals is adjusted to be synchronized with the second incremental signal by a synchronization means. Since the second incremental pattern has 0 and 1 conditions in pitches $2^{-2}$, a resolution $2^{n+1}$ times as large as that of the 1-track type absolute pattern can be obtained.

The interpolation means divides the length of a minimum read unit $\lambda$ in the following ways: ① Phase pitch positions every $2^{-2}\lambda$ in pitch $\lambda$ are divided by performing an analog operation processing using detected signals obtained from the first incremental pattern. ② $2^n$ or more incremental signals in which cycles are $\lambda$ and phase differs respectively are generated in a manner such that a plurality of sensors are positioned along patterns of the first incremental pattern. The phase positions every $2^{-n}$ in pitch $\lambda$ are divided by the difference of phase of each incremental signal and n-bit address codes are generated to discriminate the phase positions every $2^{-n}\lambda$ alternately.

In the former analog operation, the pitch of a triangular wave obtained from the detector, as shown in FIG. 7, may be divided by interpolation based on phase. In an example of the first embodiment described hereinafter, for example, there is another way of discriminating a phase position every $\lambda/2, \frac{1}{4}\lambda, \ldots 2^{-n}\lambda$ in such a manner that two pairs of detectors, of the type shown in FIG. 7A, are positioned with $\lambda/4$ of a phase difference, two obtained triangular waves are considered to be sine and cosine waves and a value of a tangent (tan $\theta$) at an optional phase position $\theta$ is found, whereby the value of the tangent is compared with a value on a curve of a tan $\theta$ of a standard $\lambda$ cycle.

In the latter example of obtaining a plurality of incremental signals having different phases from the first incremental pattern, as the second embodiment described hereinafter, $2^n$ detectors of the type shown in FIG. 7A are positioned on the first incremental track with $2^{-n}\lambda$ of phase difference, $2^n$ incremental signals every $2^{-n}\lambda$ are generated, and a digital operation or a one-to-one conversion of combination of the signals is carried out, whereby phase positions every $2^{-n}\lambda$ is discriminated.

Since it seems that phases of incremental signal obtained from the first incremental signals are more or less distorted mutually or absolutely by uneven characteristics of the sensors and errors of mounting positions of the sensors, the phases are conformed to the second incremental signal by the synchronization means.

In the case of disposing the second interpolation means on the detection section of the absolute encoder of the present invention, the second interpolation means subdivides the second incremental pattern which is a minumum division unit in the above-described absolute encoder and produces incremental signals for mutually discriminating each section.

In an absolute encoder of the present invention, as described above, resolution is improved but two incremental patterns will be sufficient for the encoder. In the case of the absolute encoder shown in FIG. 6, phases of a large number of incremental patterns are adjusted while mounting sensors. Whereas the absolute encoder of the present invention does not require the phase adjustment and is suitable for the miniaturization of the code plate. Since discrimination of minimum sections is performed by the incremental patterns, highly precise reading can be performed by using a cyclic characteristic of a pattern.

In an absolute encoder of the present invention, although the second incremental pattern is a minute pattern which is close to a limit, judging from sensitivity of sensors, absolute positions of further high resolution can be discriminated by interpolating the second incremental pattern.

BRIEF DESCRIPTION OF THE DRAWINGS

The manner in which the foregoing and other objects of the present invention are accomplished will become apparent from the accompanying specification and claims considered together with the drawings, wherein:

In the drawings, like references numerals represent like or corresponding sections.

FIG. 5A is a chart diagram of each incremental signal. FIG. 5B is an enlarged view of part of FIG. 5A in a direction of $\lambda$.

FIG. 7A is a vertical section view of the detector section. FIG. 7B is a line diagram of the amount of light detected from the detector section. FIG. 7C is a line view of incremental signals obtained from the amount of the light detected.

DETAILED DESCRIPTION OF THE PREFERRED EMBODIMENTS

A preferred embodiment of this invention is described below with reference to the accompanying FIGURES.

Figure 1:
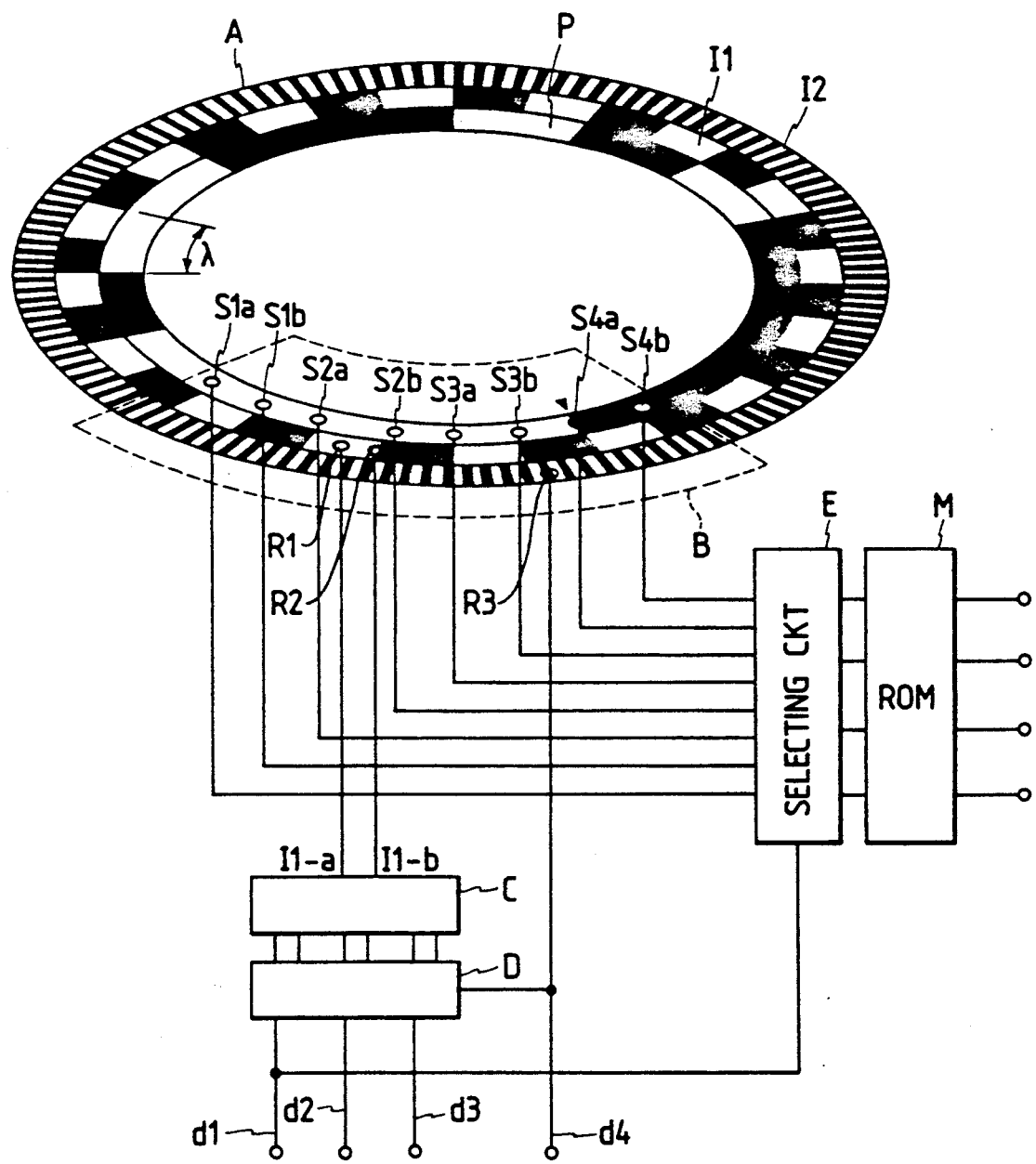
FIG. 1 is a view showing the construction of the first embodiment of the present invention.

FIG. 1 is a view showing the construction of the first embodiment of the present invention.

Referring to FIG. 1, the first incremental pattern track I1 with pitch $\lambda$ and the second incremental pattern track I2 with pitch $\lambda/8$ are formed on the code plate A in parallel with the 1-track type absolute pattern track P whose length of a minimum reading unit is $\lambda$. The first sensor group comprising photo sensors S1a to S4a, the second sensor group comprising photo sensors S1b to S4b, photo sensors R1 and R2 for detecting tracks I1 with $\lambda/4$ of phase difference, and photo sensor R3 for detecting track I2 are mounted on the detector section B, shown by broken line, in roder to detect 4 minimum reading units which are next to one another on the track P. The output of the first and second sensor groups are input to a memory circuit M via a selection circuit E, the outputs of the sensors R1 and R2 are input to the interpolation circuit C, and the output of the sensor 3 is input to a synchronization circuit D, respectively.

Figure 7A:
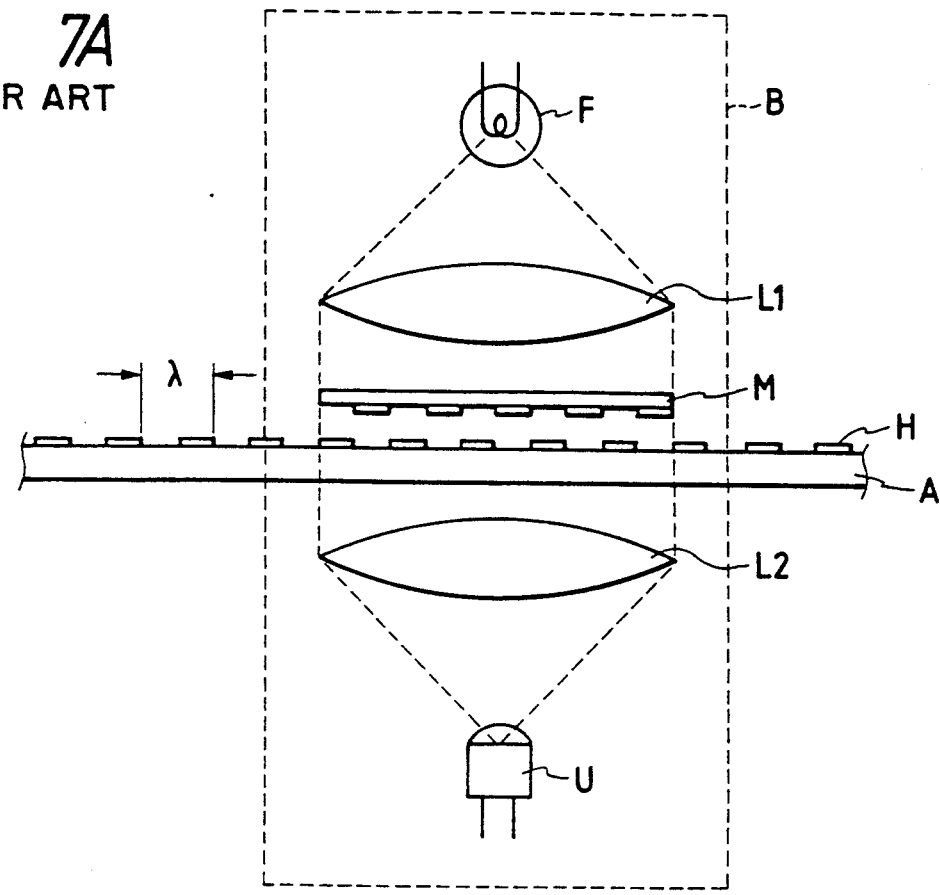
FIGS. 7A to 7C are views showing how to detect incremental patterns utilizing cyclic characteristics of patterns.
Figure 7B:
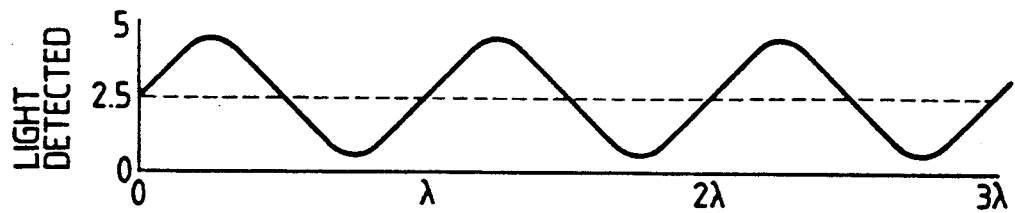
Figure 7C:
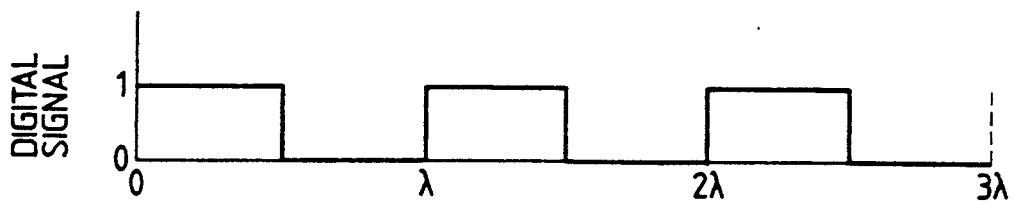

The reason two pairs of sensor groups are mounted on the track P is that the reading of tracks is performed out of a border of a minimum reading unit. As the positional relationships of phases between the code plate A and detector section B are deviated by $\lambda/2$, the selection circuit E switches the first sensor group to the second sensor group by turns and thus the sensor group positioned at the border is not used. In FIG. 1, photo sensors R1 to R3 are marked with simple circles. However, in fact, the detection utilizing a characteristic of patterns is performed as shown in FIG. 7A and each output of the sensors R1 to R3 is a pseudo sine wave which goes up and down once in a 1-pitch movement.

The track P represents all 4-bit codes in a cycle sequence which is moved from a symbol $\nabla$ in a clockwise direction; and white and black sections mean 0 and 1 respectively, wherein the sequence is

0000100110101111.

Each of the 4-bit codes (representing 4-digit numbers) on the sequence differs from the others. As shown in FIG. 1, if the detector section B is moved in a clockwise direction in succession, 4-bit codes which are obtained from the outputs of the photo sensors S1-S4 are 16 types; 0000, 0001, 0010, 0100, 1001, 0011, 0110, 1101, 1010, 0101, 1011, 0111, 1111 1110, 1100, and 1000 every $\lambda$ movement quantity. The codes discriminate each of 16 absolute positions. These codes are converted to ascending order or descending order 4-bit codes in the memory circuit M in accordance with a cross-reference list.

Figure 3:
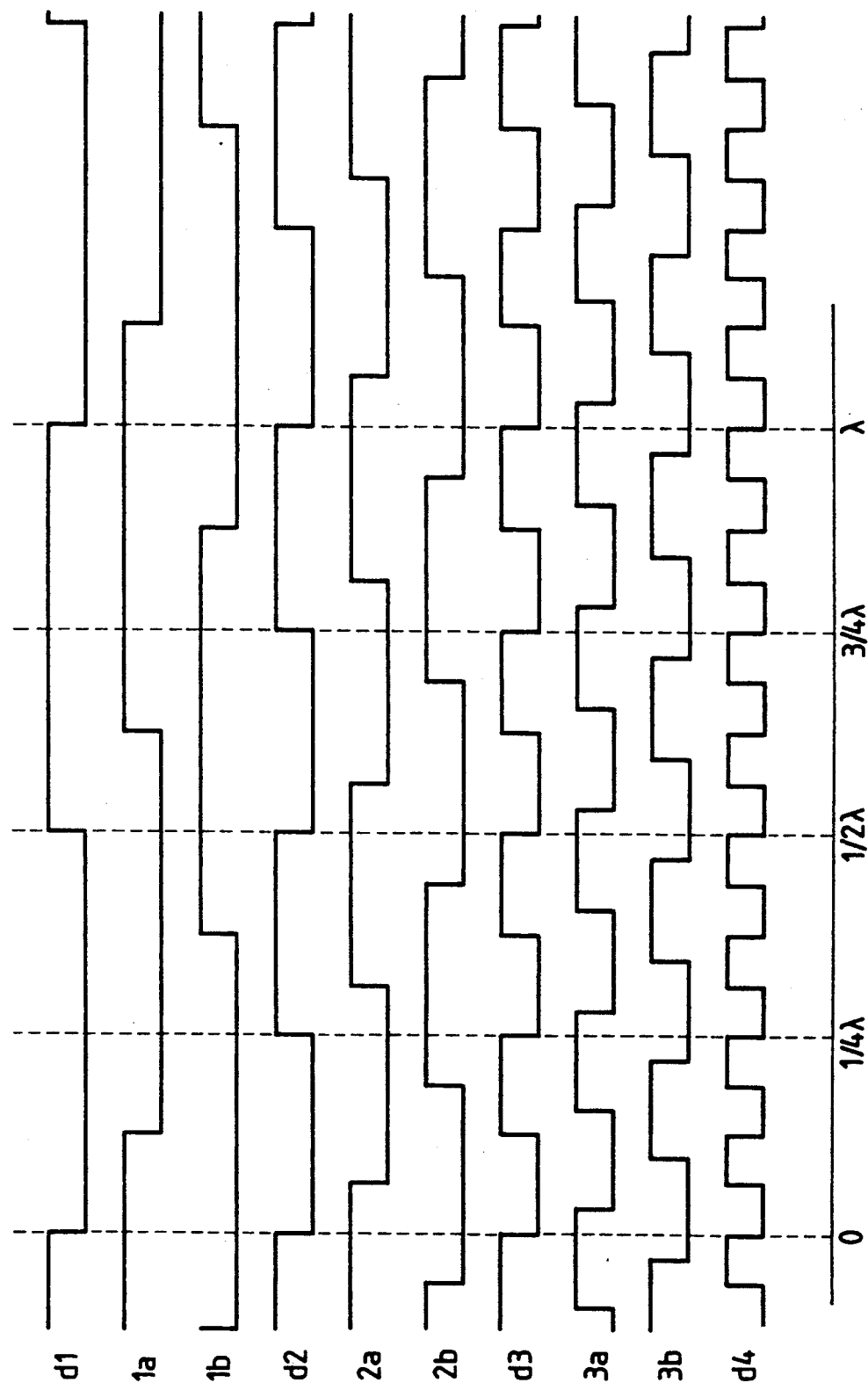
FIG. 3 is a chart diagram illustrating the operation of the absolute encoder of the second embodiment of the present invention.

Two pseudo sine waves having $\lambda/4$ of a phase difference are detected at the track I1 by the sensors R1 and R2. Pairs of square waves 1a and 1b, 2a and 2b, and 3a and 3b which have three kinds of cycles with pitch $\lambda$, pitch $\lambda/2$, and pitch $\frac{1}{4}\lambda$ respectively, and whose phases vary in a predetermined ratio on each cycle, as shown in FIG. 3, are generated from the two pseudo sine waves. These square waves are input to the synchronization circuit D. The synchronization circuit D generates the square waves d1, d2, and d3, respectively from the square waves 1a and 1b, 2a and 2b, and 3a and 3b, and a standard square wave d4 is formed from an output of the sensor R3. The switching of the first sensor group and the second sensor group in the above-described selection circuit E is performed according to the level (H, L) of the square wave d1.

Figure 6:
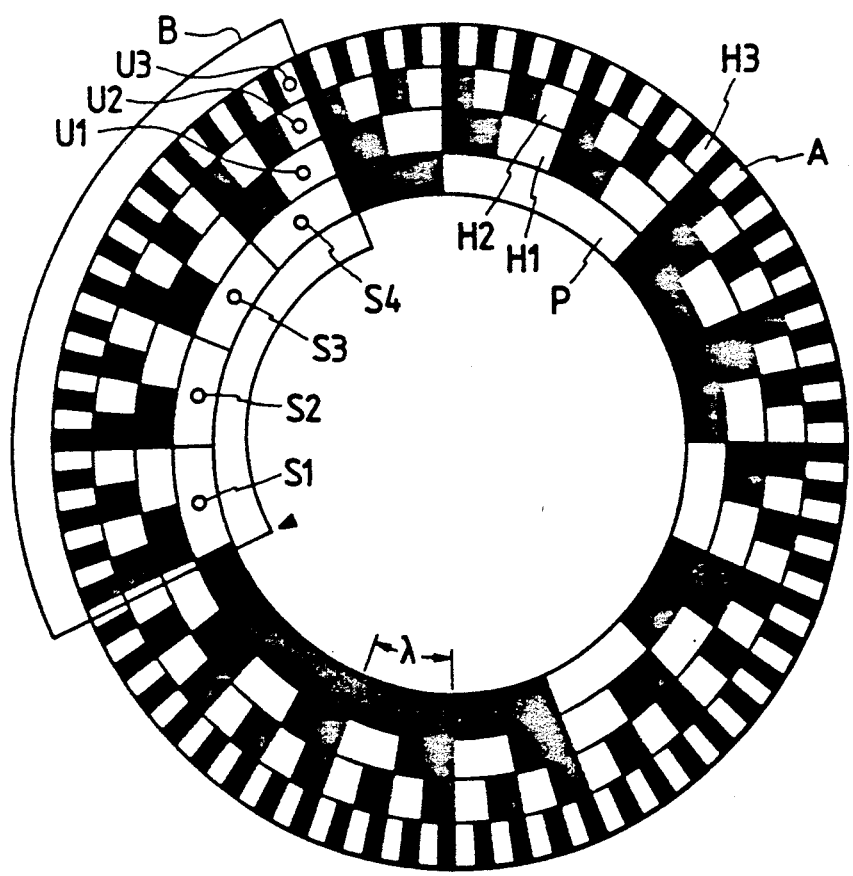
FIG. 6 is a view showing the construction of the absolute encoder of a conventional example.

Similar to the absolute encoder in FIG. 6, 8 codes are obtained in a phase position every $\lambda/8$: 111, 110, 101, 100, 011, 010, 001, and 000. Therefore, as the high order 4 digits with 4-bit signals obtained from the track P, the middle order 3 digits with 3-bit signals obtained from square waves d1 to d3, and the low order 1 digit with 1-bit signals obtained from track I2, absolute positional information which discriminates a total of 8 bits i.e. 256 phase positions equivalent to 1 cycle of the code plate A can be formed.

Figure 2:
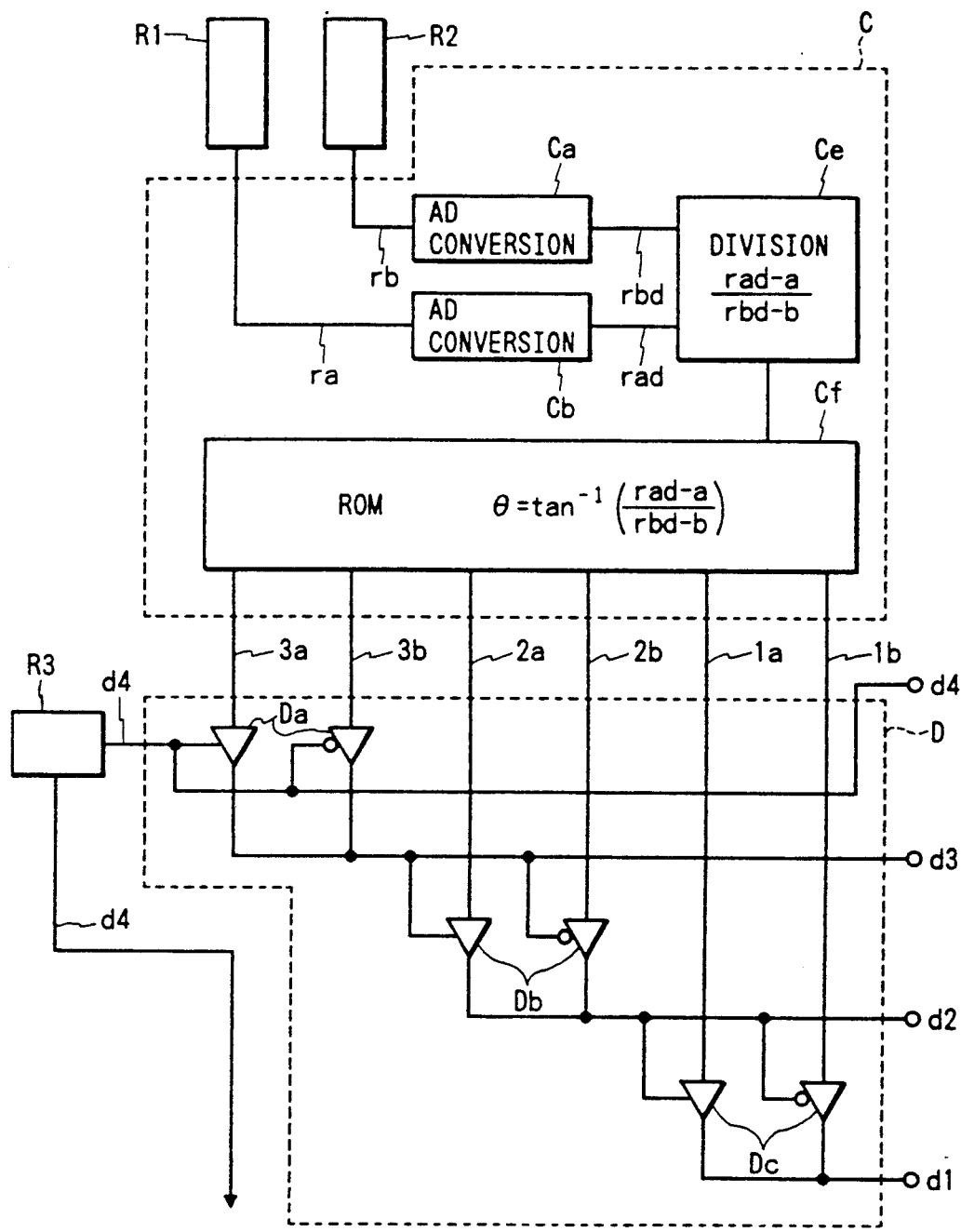
FIG. 2 is a circuit diagram illustrating the operation of the absolute encoder of the first embodiment of the present invention.

FIG. 2 is a circuit diagram illustrating an analog operation in the interpolation circuit C (first interpolation means for producing a first absolute position signal) and a synchronous processing in the synchronization circuit D.

FIG. 3 is a signal chart diagram illustrating an analog operation in the interpolation circuit C and a synchronous processing in the synchronization circuit D.

Referring to FIG. 2, the interpolation circuit C is composed of two analog-to-digital converters Ca and Cb, divider Ce, $\tan^{-1}$ cross-reference list Cf, and the synchronization circuit D is composed of selection means Da, Db, and Dc.

The sensors R1 and R2 read two sine wave-shaped inputs ra and rb (first incremental signal) having $\lambda/4$ of a phase difference. The inputs ra and rb (A-phase and B-phase, respectively) are input to analog-to-digital converters Ca and Cb in the interpolation circuit C and converted to digital signals which represent numerical values in accordance with voltage levels.

In Ce, digital values a and b equivalent to the center potential are subtracted from rad and rbd which are converted from ra and rb in an analog-to-digital converters Ca and Cb. Then (rad-a) is divided by (rbd-b) and the results are sent to Cf.

The cross-reference list Cf compares values on a tan $\theta$ curve to each phase position $\theta$ restored in cycle $\lambda$ with a (rad-a)/(rbd-b) ratio, discriminates where the resulting value is in a phase position $\theta$, and outputs the 6 square waves of 1a, 1b, 2a, 2b, 3a, and 3b, as shown in FIG. 3. The square waves are composed of $\lambda$ cycle waves 1a and 1b which fall approximately in $\pm\lambda/8$ of a phase position $\theta$, $\lambda/2$ cycle waves 2a and 2b which fall approximately in $\pm\lambda/16$ of a phase position $\theta$, and $\lambda/4$ cycle waves 3a and 3b which fall approximately in $\pm\lambda/32$.

Next, the square waves 1a, 1b, 2a, 2b, 3a, and 3b are input to the synchronization circuit D. The selection means Da generates an incremental signal d3 synchronized with a signal d4 (second incremental signal) from the square wave 3a and 3b by using a cycle $\lambda/8$ incremental signal d4 generated from a sine wave which is read by the sensor R3 from the tracks I2. By selecting the square wave 3a at the time that the signal d4 is at a 1 level and the square wave 3b at the time that the signal is at a 0 level, a signal d3 synchronized with the rise and fall phases of the signal d4 is obtained.

In the same way as above, the selection means Db generates a $\lambda/2$ cycle incremental signal synchronized with the signals d3 and d4 from the square waves 2a and 2b by using this $\lambda/4$ cycle signal d3. That is, the selection means selects the square wave 2a at the time that the signal da is at a 1 level and the square wave 2b at the time that the signal is at a 0 level.

The selection means DC generates a cycle $\lambda$ incremental signal d1 synchronized with the signals d2 to d4 from the square waves 1a and 1b by using this $\lambda/2$ signal d2. That is, the selection means selects the square wave 1a at the time that the square wave d2 is at a 1 level and the square wave 1b at the time that the square wave d2 is at a 0 level.

FIG. 3 shows the square waves d1 to d3 (synchronized first absolute position signal) synchronized with the square wave d4 by the synchronization circuit D. These incremental signals d1 to d4 comprise the 4 digit absolute positional information which mutually discriminates each phase position every $\lambda/16$ mutually on the positional relationships of the length $\lambda$ between the code plate A and the detector section B.

Figure 4:
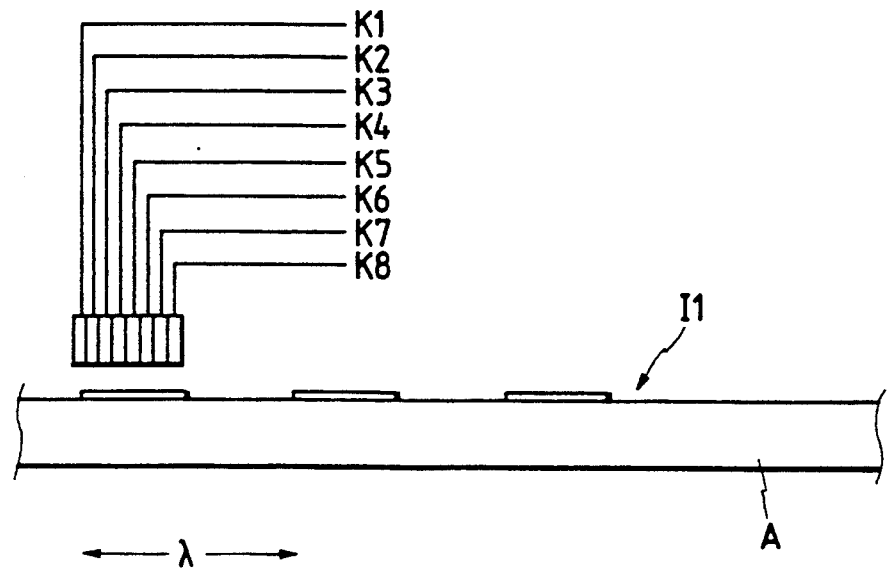
FIG. 4 is a vertical section view illustrating the absolute encoder of the second embodiment of the present invention.

FIG. 4 is a vertical section view illustrating the absolute encoder of the second embodiment of the present invention.

Figures 5A, 5B:
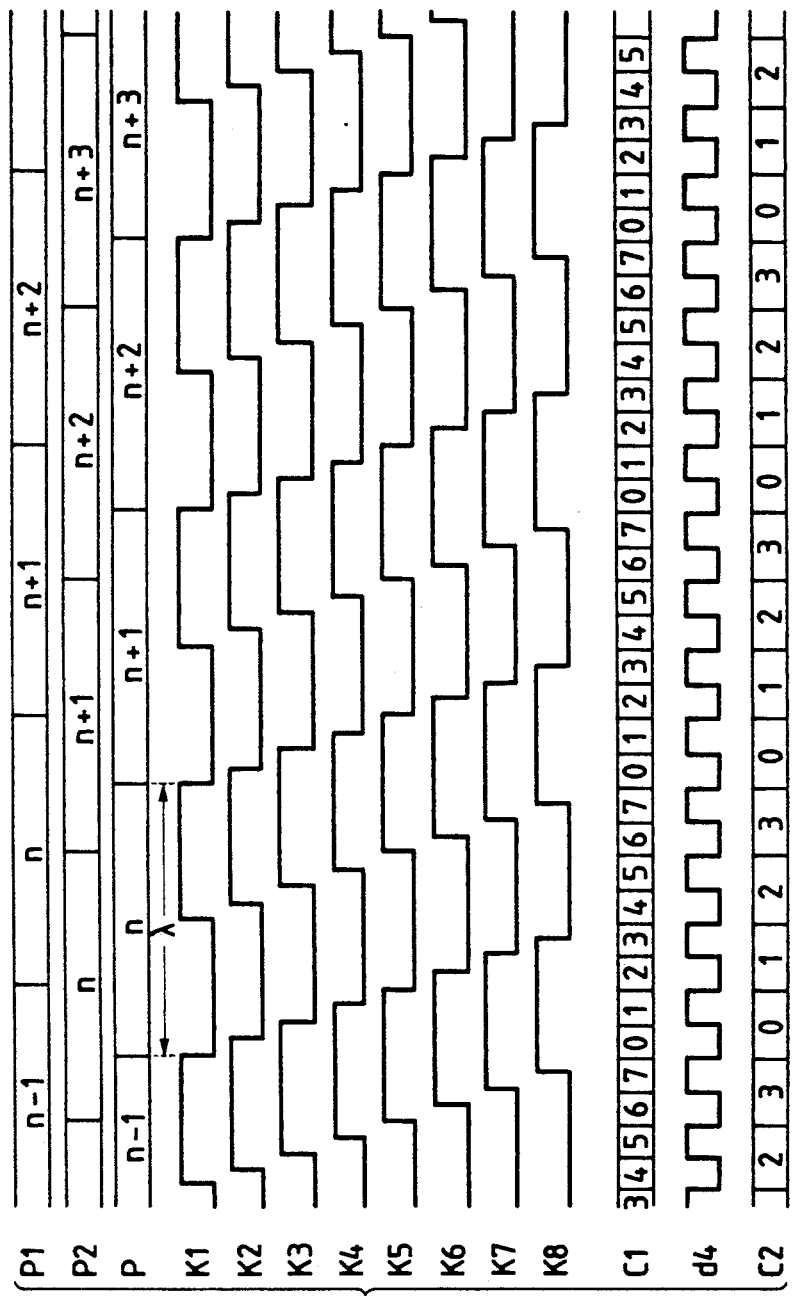
FIGS. 5A and 5B are views illustrating the second embodiment of the present invention.

FIGS. 5A and 5B illustrate the absolute encoder of the second embodiment of the present invention. FIG. 5A is a chart showing each incremental signal. FIG. 5B shows an enlarged part of FIG. 5A as seen in a $\lambda$ direction.

In an example of the second embodiment, incremental track I1 with pitch $\lambda$ is arranged in parallel with the second incremental track I2 with a pitch $\lambda/8$ and the absolute track P on the code plate A, and 8 sensors K1 to K8 which are each shifted $\lambda/16$ are arranged along the track I1.

As shown in FIG. 5A, the cycle $\lambda$ square waves k1 to k8 which rise approximately with the phase difference of $\lambda/8$ (22.5 degrees) are generated from the output of the sensors K1 to K8 and the second incremental signal d4 whose cycle $\lambda/8$ is generated from the track I2. Similar to the first embodiment, two sensors detect one minimum reading unit, such as p1 and p2, with the phase difference of $\lambda/2$.

It is easy to correspond numbers 0 to 7 with the square waves k1 to k8. Then a C1 signal is output. It is impossible for the phase difference of the C1 signal output and the signal d4 to be 0, no matter where the C1 signal is output and where the signal d4 is positioned. The phase difference of the C1 signal output and the signal d4 are as shown in FIG. 5B.

Since an absolute position synchronized with the signal d4 should be obtained, C2 patterns are obtained by performing the following operation on the output C1.

| | d4 | L | H |
|---|---|---|---|
| C1 | Even number | C1/2 | (C1-2)/2 |
| | Uneven number | (C1-1)/2 | (C1-1)/2 |

In FIG. 5A, the signal p2 is selected when the numbers are 0 and 1 and the signal p1 is selected when the numbers are 2 and 3, by means of which signal p is obtained. By processing the signals as described above, an absolute position synchronized with d4 is obtained.

What is claimed is:

1. An absolute encoder comprising:

a code plate having a 1-track type absolute pattern whose minimum read unit length is $\lambda$, a first incremental pattern with a pitch $\lambda$, and a second incremental pattern with a pitch $2^{-n}\lambda$, each of which patterns is formed on said code plate;

a detector section including means for detecting the absolute pattern and thereby obtain an absolute pattern signal, means for detecting said first incremental pattern and thereby obtain a first incremental signal, and means for detecting said second incremental pattern and thereby obtain a second incremental signal, said detector section being movable relative to said code plate;

first interpolation means for producing, by interpolating said first incremental signal, an absolute position signal indicating an absolute position within one pitch of said first incremental signal, minimum read unit of said absolute position signal being shorter than the pitch $2^{-n}\lambda$ of said second incremental signal; and synchronization means for synchronizing said absolute position signal obtained by said first interpolation means to said second incremental signal and thereby obtain a synchronized absolute position signal;

wherein said absolute pattern signal, said second incremental signal and said synchronized absolute position signal indicate a relative positional relationship between said code plate and said detector section.

* * * * *